United States Patent
Okada et al.

(10) Patent No.: US 8,552,437 B2
(45) Date of Patent: Oct. 8, 2013

(54) FLUORESCENT SUBSTANCE, PROCESS FOR PRODUCTION OF FLUORESCENT SUBSTANCE, LIGHT-EMITTING DEVICE AND LIGHT-EMITTING MODULE

(75) Inventors: Aoi Okada, Tokyo (JP); Yumi Fukuda, Tokyo (JP); Takahiro Sato, Kawasaki (JP); Iwao Mitsuishi, Tokyo (JP); Naotoshi Matsuda, Chigasaki (JP); Ryosuke Hiramatsu, Kawasaki (JP); Kunio Ishida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/875,507

(22) Filed: Sep. 3, 2010

(65) Prior Publication Data

US 2011/0220919 A1    Sep. 15, 2011

(30) Foreign Application Priority Data

Mar. 9, 2010   (JP) .................................. 2010-51630

(51) Int. Cl.
*H01L 33/16* (2010.01)
*C09K 11/08* (2006.01)
*H01L 33/40* (2010.01)

(52) U.S. Cl.
USPC 257/88; 257/98; 257/E33.061; 257/E33.001; 252/301.4 R

(58) Field of Classification Search
USPC ........................ 257/88, 98, E33.061, E33.001, 257/E33.059; 252/301.4 R, 301.4 F, 301.6 R; 313/503
See application file for complete search history.

(56) References Cited

U.S. PATENT DOCUMENTS

| | | | |
|---|---|---|---|
| 2003/0030368 A1 | 2/2003 | Ellens et al. | |
| 2007/0052342 A1 | 3/2007 | Masuda et al. | |
| 2009/0096361 A1* | 4/2009 | Fukuda et al. | 313/504 |
| 2009/0267485 A1* | 10/2009 | Nagatomi et al. | 313/503 |
| 2010/0102707 A1 | 4/2010 | Fukuda et al. | |
| 2010/0187974 A1* | 7/2010 | Zhang et al. | 313/503 |

FOREIGN PATENT DOCUMENTS

| | | |
|---|---|---|
| JP | 2003-124527 | 4/2003 |
| JP | 2006-8948 | 1/2006 |
| JP | 2006-307090 | 11/2006 |
| WO | WO 2006/093298 A1 | 9/2006 |
| WO | WO 2007/105631 A1 | 9/2007 |
| WO | WO 2008/096300 A1 | 8/2008 |
| WO | WO 2009/003378 A1 | 1/2009 |

OTHER PUBLICATIONS

U.S. Appl. No. 13/218,808, filed Aug. 26, 2011, Kato, et al.
U.S. Appl. No. 13/221,042, filed Aug. 30, 2011, Okada, et al.
U.S. Appl. No. 13/214,410, filed Aug. 22, 2011, Mitsuishi.
U.S. Appl. No. 13/214,444, filed Aug. 22, 2011, Mitsuishi.
U.S. Appl. No. 13/034,137, filed Feb. 24, 2011, Mitsuishi, et al.

(Continued)

*Primary Examiner* — Victor A Mandala
*Assistant Examiner* — Whitney T Moore
(74) *Attorney, Agent, or Firm* — Oblon, Spivak, McClelland, Maier & Neustadt, L.L.P.

(57) ABSTRACT

The embodiment provides a process for production of an oxynitride fluorescent substance. An compound containing In or Ga is adopted in the process as a material thereof. The red fluorescent substance produced by the process can be combined with a semiconductor light-emitting element, so as to be used in a light-emitting device or a light-emitting module.

7 Claims, 9 Drawing Sheets

(56) References Cited

OTHER PUBLICATIONS

U.S. Appl. No. 13/033,917, filed Feb. 24, 2011, Mitsuishi, et al.
U.S. Appl. No. 13/033,960, filed Feb. 24, 2011, Mitsuishi, et al.
U.S. Appl. No. 13/033,954, filed Feb. 24, 2011, Mitsuishi, et al.
U.S. Appl. No. 13/034,120, filed Feb. 24, 2011, Mitsuishi, et al.
U.S. Appl. No. 13/039,082, filed Mar. 2, 2011, Kato, et al.
U.S. Appl. No. 13/037,635, filed Mar. 1, 2011, Okada, et al.
The Extended European Search Report issued Sep. 26, 2011, in Application No. / Patent No. 10251563.2-1218 / 2368965).
Office Action issued Jul. 13, 2012, in Korean Patent Application No. 10-2010-92279, filed Sep. 20, 2010 (with English-language Translation).
Office Action issued Jul. 20, 2012, in Japanese Patent Application No. 2010-051630, filed Mar. 9, 2010 (with English-language Translation).
Combined Office Action and Search Report issued Mar. 7, 2013 in Taiwanese Patent Application No. 099130061 with English language translation.
Office Action issued on Jan. 23, 2013, in Chinese Patent Application No. 201010277528.5 with English translation.

* cited by examiner

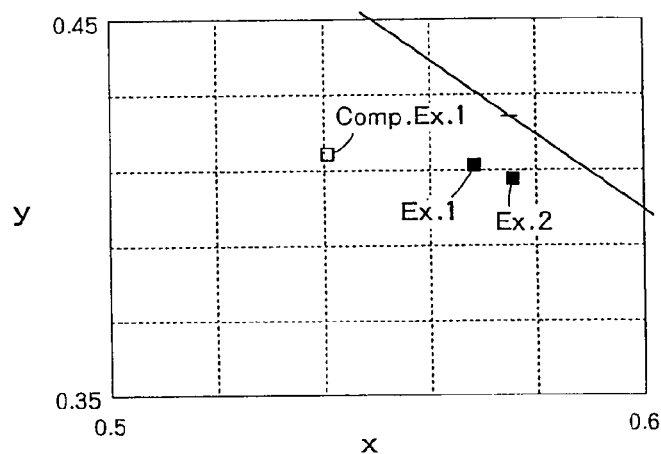
F I G. 10
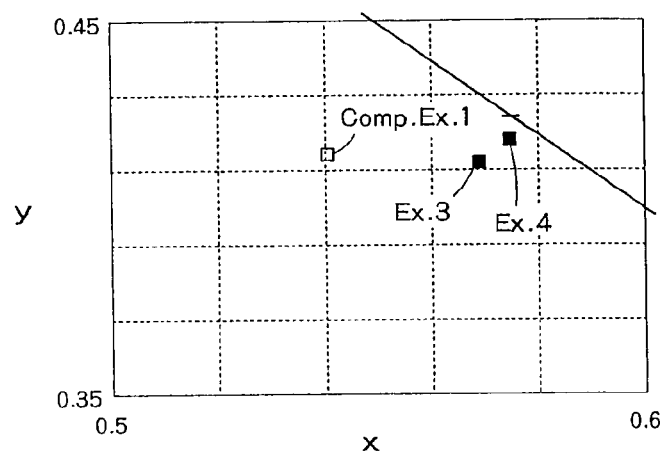
F I G. 11
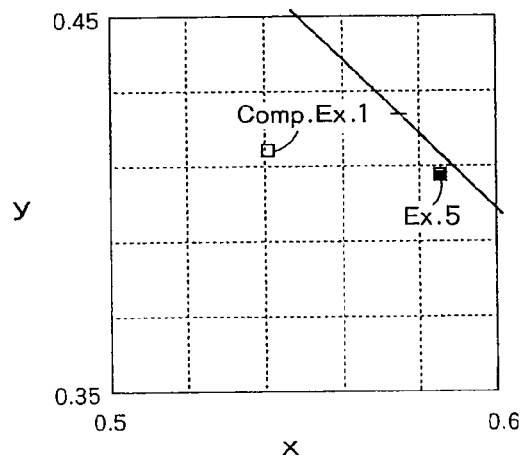
F I G. 12

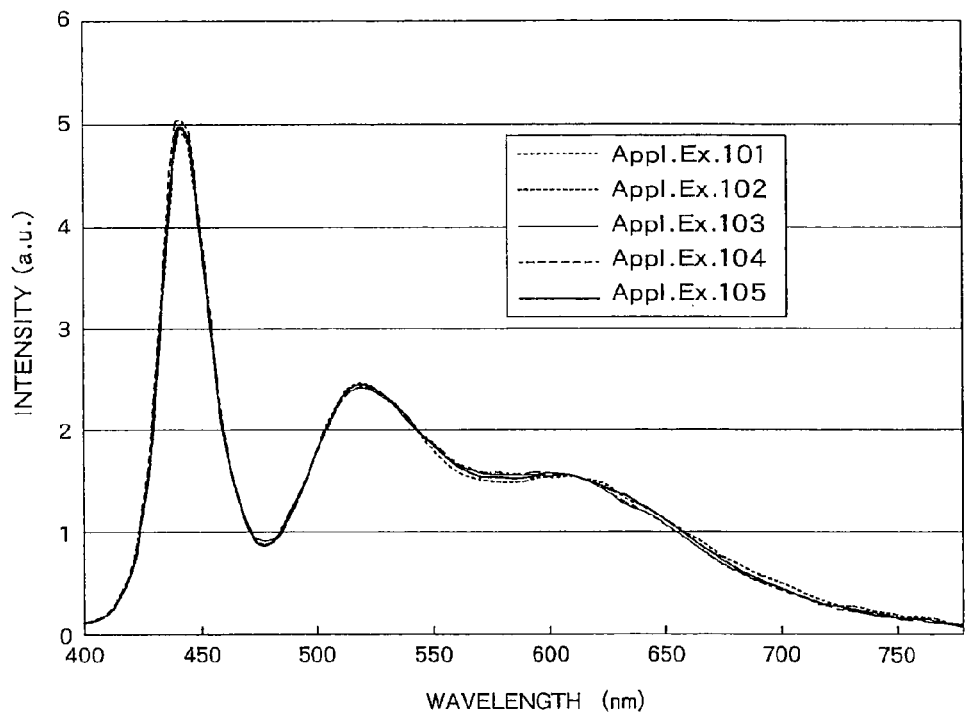
F I G. 15
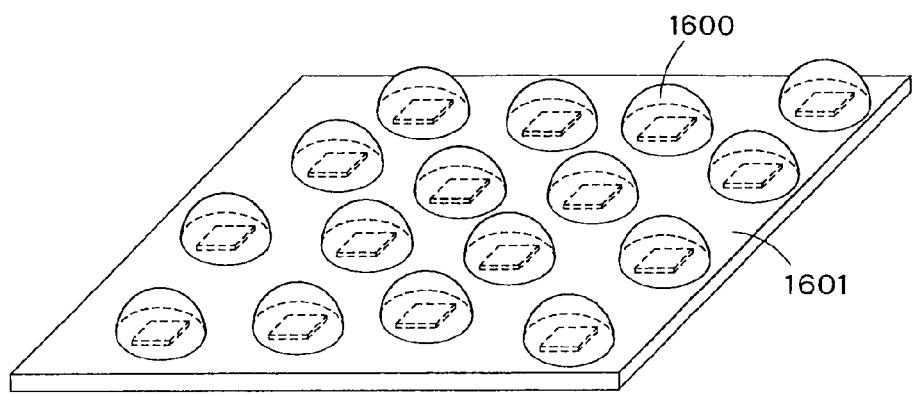
F I G. 16

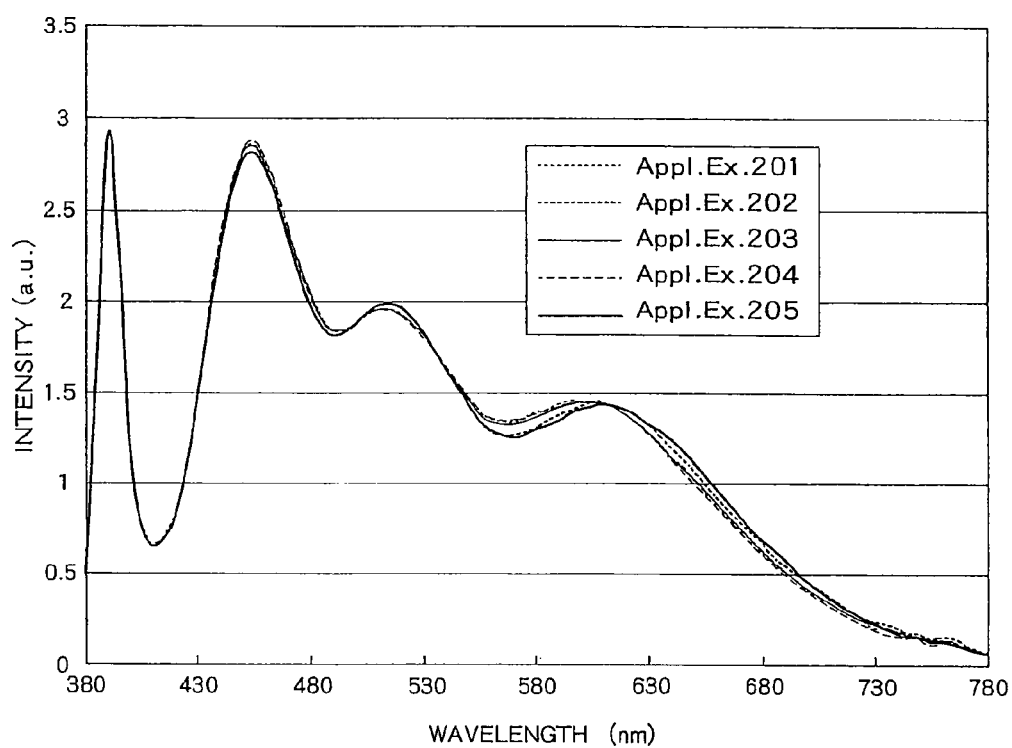
F I G. 18
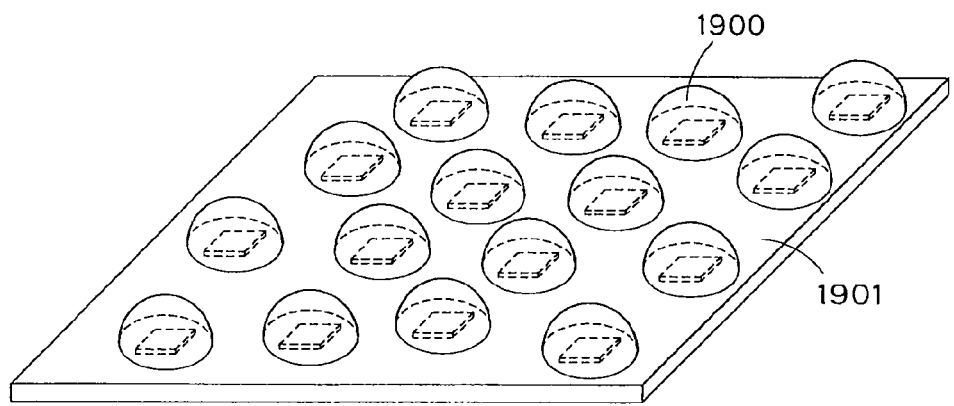
F I G. 19

FLUORESCENT SUBSTANCE, PROCESS FOR PRODUCTION OF FLUORESCENT SUBSTANCE, LIGHT-EMITTING DEVICE AND LIGHT-EMITTING MODULE

CROSS-REFERENCE TO RELATED APPLICATIONS

This application is based upon and claims the benefit of priority from the prior Japanese Patent Application No. 2010-51630, filed on Mar. 9, 2010; the entire contents of which are incorporated herein by reference.

FIELD

The embodiment relates to a fluorescent substance, a process for production of the fluorescent substance, a light-emitting device and a light-emitting module.

BACKGROUND

LED lamps, which utilize light-emitting diodes, are used in many displaying elements of instruments such as mobile devices, PC peripheral equipments, OA equipments, various kinds of switches, light sources for backlighting, and indicating boards. The LED lamps are strongly required not only to have high efficiency, but also to be excellent in color rendition when used for general lighting or to deliver a wide color gamut when used for backlighting. For the purpose of satisfying those requirements, it is necessary to improve fluorescent substances used in light-emitting parts of LEDs. For example, in order to increase the efficiency of lamps, it is necessary to adopt highly efficient fluorescent substances in the LEDs. Further, for improving the color rendition and for broadening the color gamut of lamps, it is desired to improve chromaticity of luminescence emitted from the fluorescent substances.

On the other hand, high load LEDs generally become so hot while working that fluorescent substances used therein are heated up to a temperature of approx. 100 to 200° C. When the fluorescent substances are thus heated, their emission intensity is generally lowered. Accordingly, it is desired that the emission intensity be less lowered even if the fluorescent substances are heated. In other words, it is desired that the temperature quenching be less induced.

As fluorescent substances improved in temperature quenching, there are known red SiAlON phosphors comprising mainly silicon and aluminum (WO2007/105631). Those phosphors are, for example, represented by the formula of $(Sr_{1-x}Eu_x)_a Si_b Al_c O_d N_e$, and they are improved in temperature quenching as compared with conventional phosphors such as $Sr_2 Si_5 N_8$:Eu and CaS:Eu.

BRIEF DESCRIPTION OF THE DRAWINGS

FIG. 10 shows chromaticity points of emissions given by the red fluorescent substances of Examples 1, 2 and Comparative Example 1.

FIG. 11 shows chromaticity points of emissions given by the red fluorescent substances of Examples 3, 4 and Comparative Example 1.

FIG. 12 shows chromaticity points of emissions given by the red fluorescent substances of Example 5 and Comparative Example 1.

FIG. 15 shows emission spectra given by the light-emitting devices of Application Examples 101 to 105.

FIG. 16 is a conceptual sketch of the light-emitting device module produced in each of Application Examples 151 to 155 and Comparative Application Examples 152 to 156.

FIG. 18 shows emission spectra given by the light-emitting devices of Application Examples 201 to 205.

FIG. 19 is a conceptual sketch of the light-emitting device module produced in each of Application Examples 251 to 255 and Comparative Application Examples 252 to 254 and 256.

DETAILED DESCRIPTION

Figure 1:
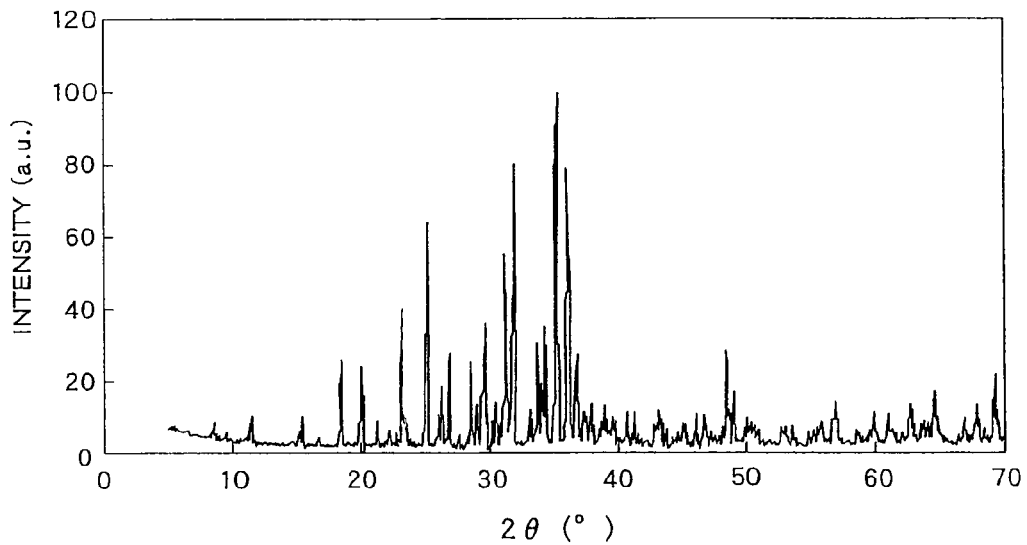
FIG. 1 is an XRD profile of $Sr_2 Al_3 Si_7 ON_{13}$.

One aspect of the embodiment resides in a process for production of a fluorescent substance which emits luminescence having a peak in the wavelength range of 570 to 650 nm under excitation by light in the wavelength range of 250 to 500 nm, comprising the step of:

mixing a compound containing a metal element $M^1$ selected from the group consisting of tetravalent metal elements, a compound containing a metal element $M^2$ selected from the group consisting of trivalent metal elements other than In(III) and Ga(III), a compound containing a metal element M selected from the group consisting of metal elements other than $M^1$, $M^2$, In(III) and Ga(III), a compound containing an emission center element EC other than any of the aforesaid metal elements, and a compound containing a metal element L selected from the group consisting of In(III) and Ga(III)

to prepare a material mixture, and firing the material mixture.

Another aspect of the embodiment resides in a first fluorescent substance which emits luminescence having a peak in the wavelength range of 570 to 650 nm under excitation by light in the wavelength range of 250 to 500 nm and which is obtained by mixing a compound containing a metal element $M^1$ selected from the group consisting of tetravalent metal elements, a compound containing a metal element $M^2$ selected from the group consisting of trivalent metal elements other than In(III) and Ga(III), a compound containing a metal element M selected from the group consisting of metal elements other than $M^1$, $M^2$, In(III) and Ga(III), a compound containing an emission center element EC other than any of the aforesaid metal elements, and a compound containing a metal element L selected from the group consisting of In(III) and Ga(III)

to prepare a material mixture, and firing the material mixture.

Still another aspect of the embodiment resides in a second fluorescent substance represented by the following formula (I):

$$(M_{1-x}EC_x)_a M^1{}_b M^2 L_c O_d N_e \tag{I}$$

in which $M^1$ is a metal element selected from the group consisting of tetravalent metal elements, $M^2$ is a metal element selected from the group consisting of trivalent metal elements other than In(III) and Ga(III), L is a metal element selected from the group consisting of In(III) and Ga(III), M is a metal element selected from the group consisting of metal elements other than $M^1$, $M^2$, In(III) and Ga(III), EC is an emission center element other than any of the aforesaid metal elements, and x, a, b, c, d and e are numbers satisfying the conditions of $0<x<0.4$, $0.65<a<0.80$, $2<b<3$, $0<c<0.1$, $0.3<d<0.6$ and $4<e<5$, respectively; and emitting luminescence having a peak in the wavelength range of 570 to 650 nm under excitation by light in the wavelength range of 250 to 500 nm.

Further, a light-emitting device according to an embodiment comprises a light-emitting element (S1) giving off light in the wavelength range of 250 to 500 nm, the above first or second fluorescent substance (R), and another fluorescent substance (G) emitting luminescence having a peak in the wavelength range of 430 to 580 nm under excitation by light given off from the light-emitting element (S1).

Furthermore, a light-emitting device according to another embodiment comprises a light-emitting element (S2) giving off light in the wavelength range of 250 to 430 nm, the above first or second fluorescent substance (R), another fluorescent substance (G) emitting luminescence having a peak in the wavelength range of 490 to 580 nm under excitation by light given off from said light-emitting element (S2), and still another fluorescent substance (B) emitting luminescence having a peak in the wavelength range of 400 to 490 nm under excitation by light given off from said light-emitting element (S2).

Still further, a light-emitting device module according to an embodiment comprises a substrate and plural light-emitting devices provided thereon, each of said light-emitting devices comprising:

a light-emitting element (S1) giving off light in the wavelength range of 250 to 500 nm, the above first or second fluorescent substance (R), and another fluorescent substance (G) emitting luminescence having a peak in the wavelength range of 430 to 580 nm under excitation by light given off from said light-emitting element (S1).

Still furthermore, a light-emitting device module according to another embodiment comprises a substrate and plural light-emitting devices provided thereon, each of said light-emitting devices comprising:

a light-emitting element (S2) giving off light in the wavelength range of 250 to 430 nm;

the above first or second fluorescent substance (R), another fluorescent substance (G) emitting luminescence having a peak in the wavelength range of 490 to 580 nm under excitation by light given off from said light-emitting element (S2); and still another fluorescent substance (B) emitting luminescence having a peak in the wavelength range of 400 to 490 nm under excitation by light given off from said light-emitting element (S2).

Embodiments will now be explained with reference to the accompanying drawings.

Process for Production of Red Light-Emitting Fluorescent Substance

The process of the embodiment for production of red fluorescent substance is characterized by adopting a compound containing In(III) or Ga(III) as a material. The oxynitride fluorescent substance according to the embodiment is what is called a SiAlON phosphor, which has a matrix comprising: Si or a tetravalent metal element replacing Si, Al or a trivalent metal element replacing Al, oxide and nitrogen. In general, the oxynitride fluorescent substance can be produced by the steps of: mixing compounds containing the above elements to prepare a material mixture, and then firing the mixture. According to the embodiment, the material mixture includes a compound containing In(III) or Ga(III).

The following (1) to (5) are materials used in the process of the embodiment for production of the oxynitride fluorescent substance. Those are, (1) a compound containing a metal element $M^1$ selected from the group consisting of tetravalent metal elements, (2) a compound containing a metal element $M^2$ selected from the group consisting of trivalent metal elements other than In(III) and Ga(III), (3) a compound containing a metal element M selected from the group consisting of metal elements other than $M^1$, $M^2$, In(III) and Ga(III), (4) a compound containing an emission center element EC other than any of the aforesaid metal elements, and (5) a compound containing a metal element L selected from the group consisting of In(III) and Ga(III).

The metal element $M^1$ contained in the material (1) is Si or an element replacing Si, and it constitutes a SiAlON phosphor intended to be formed by the embodiment and is selected from the group consisting of tetravalent metal elements. The tetravalent metal element $M^1$ is preferably selected from the IVA and IVB groups, and examples thereof include Si, Ge, Sn, Ti, Zr and Hf. As the metal element $M^1$, Si is particularly preferred. The metal element $M^1$ may be either a single element or a combination of two or more elements. The compound of $M^1$ is preferably a nitride, oxide or carbide.

The metal element $M^2$ contained in the material (2) is Al or an element replacing Al, and it constitutes a SiAlON phosphor intended to be formed by the embodiment and is selected from the group consisting of trivalent metal elements. The trivalent metal element $M^2$ is preferably selected from the IIIA and IIIB groups, and examples thereof include Al, B, Sc, Y, La, Gd and Lu. As the metal element $M^2$, Al is particularly preferred. However, the metal element $M^2$ is neither In(III) nor Ga(III). The metal element $M^2$ may be either a single element or a combination of two or more elements. The compound of $M^2$ is preferably a nitride, oxide or carbide.

The metal element M contained in the material (3) is selected from the group consisting of metal elements other than the above $M^1$, $M^2$, In(III) and Ga(III). Specifically, the metal element M is preferably selected from the IA (alkali metal) group elements such as Li, Na and K; the IIA (alkaline earth metal) group elements such as Mg, Ca, Sr and Ba; the IIIA group elements such as B; the IIIB group elements such as Y and Sc; the rare earth elements such as Gd, La and Lu; or the IVA group elements such as Ge. As the metal element M, Sr is particularly preferred. The metal element M may be either a single element or a combination of two or more elements. The compound containing the element M is preferably a nitride or carbide such as cyanamide.

In the above, some elements are repeatedly included in the examples of the metal elements M and the elements $M^1$ and $M^2$. However, the metal element M in the fluorescent substance of the embodiment is so selected as to be different from the elements $M^1$ and $M^2$.

The metal element EC contained in the material (4) serves as an emission center of the fluorescent substance.

The fluorescent substance according to the embodiment has a crystal structure basically comprising the elements M, $M^1$, $M^2$ and O and/or N, but the metal element M is partly replaced with the emission center element EC.

Examples of the emission center element EC include Eu, Ce, Mn, Tb, Yb, Dy, Sm, Tm, Pr, Nd, Pm, Ho, Er, Cr, Sn, Cu, Zn, As, Ag, Cd, Sb, Au, Hg, TI, Pb, Bi and Fe. Among them, either or both of Eu and Mn can be preferably selected in consideration of emission wavelength variability and the like. The compound containing the metal element EC is preferably an oxide, nitride or carbonate.

The material (5) is a compound containing In(III) or Ga(III). Examples of the compound include oxides and nitrides such as $In_2O_3$, $Ga_2O_3$ and GaN.

The mixing ratio of the materials can be adequately controlled according to what composition the oxynitride fluorescent substance is intended to have.

The oxynitride fluorescent substance intended to be produced by the process of the embodiment emits luminescence having a peak in the wavelength range of 570 to 650 nm when excited by light in the wavelength range of 250 to 500 nm. The fluorescent substance giving that emission basically has a crystal structure of $M_2M^1{}_7M^2{}_3ON_{13}$, but the metal element M is partly replaced with the emission center element EC. Accordingly, the materials are generally so mixed that the molar ratio among the total amount of M and EC, the amount of $M^1$ and the amount of $M^2$ may be about 2:7:3. However, this value does not need to be kept strictly because the molar ratio can be controlled in view of the peak wavelength of the luminescence or the like.

Preferably, 0.1 mol % or more of the metal element M is replaced with the emission center element EC. If the amount of the replaced M is less than 0.1 mol %, it is difficult to obtain sufficient emission intensity. The metal element M can be completely replaced with the emission center element EC. However, if the amount of the replaced M is less than 50 mol %, the decrease of emission probability (concentration quenching) can be prevented to the utmost. The red fluorescent substance of the embodiment emits light in the range of yellow to red, namely, gives off luminescence having a peak in the wavelength range of 570 to 650 nm when excited by light of 250 to 500 nm.

The process of the embodiment for production of fluorescent substance is characterized by using the material (5) (i.e., compound containing the metal element L). It is indispensable in the embodiment to adopt the material (5) together with other materials, but this does not necessarily mean that the oxynitride fluorescent substance contains the metal element L. For example, if the material (5) is used in a relatively large amount, the element L is often found in analysis of the obtained oxynitride fluorescent substance. Accordingly, in the resultant fluorescent substance, the element L may replace the metal $M^1$ or the like. On the other hand, however, even if the material (5) is used in such a small amount that the element L in the resultant oxynitride fluorescent substance is in an amount below the measurement limit of the analysis, the effect of the embodiment is sometimes clearly observed. On the basis of those facts, it is considered that not only the material (5) is incorporated into the crystal of the fluorescent substance but also it may control the crystal growth thereof. Specifically, for example, it is presumed that the material (5) added in the firing step may form a liquid or gas phase capable of providing some function for crystal growth during the firing step and, as a result, may give the effect of the embodiment.

It should be noted that the above effect is observed only when the compound containing In(III) or Ga(III) is used. If compounds containing other metal elements such as Sc(III) are used, the effect of the embodiment cannot be obtained.

The fluorescent substance produced by the process of the embodiment has luminescence properties different from conventional red fluorescent substances containing Sr. For example, since an In compound is used as a material, the obtained fluorescent substance less comprises hetero-phases giving blue to green luminescence and exhibits an emission spectrum having a smaller half-width. Consequently, the fluorescent substance according to the embodiment is improved in chromaticity as compared with known Sr-containing red fluorescent substances. Further, the fluorescent substance of the embodiment is in the form of larger grains than conventional Sr-containing red fluorescent substances, and accordingly is presumed to have absorption efficiency high enough to improve the emission efficiency. Those advantages of the fluorescent substance according to the embodiment are thought to be given by the material (5) during crystal growth.

As described above, the metal element L in the material (5) does not always take the place of the trivalent metal element $M^2$ included in the crystal structure of the fluorescent substance. Accordingly, it is not necessarily reasonable to regulate the amount of the material (5) based on that of $M^2$. However, for the sake of convenience, the amount of L contained in the material (5) is regulated as follows on the basis of the amount of $M^2$ contained in the material (3); that is, the amount of L is preferably 0.1 to 50 mol %, more preferably 0.1 to 20 mol %, based on the amount of $M^2$. If the metal element L is much contained, the hetero-phases are liable to increase in producing the fluorescent substance so that the yield thereof may be lowered. This should be noted.

The process of the embodiment for production of red light-emitting fluorescent substance comprises the steps of: mixing the aforementioned materials in a desired ratio; pulverizing and mixing the mixture, generally, in a mortar; and then firing the mixture. Specifically, in the case where Sr, Eu, Si, Al and In are selected as the elements M, EC, $M^1$, $M^2$ and L, respectively, it is possible to adopt $Sr_3N_2$, AlN, $Si_3N_4$, $Al_2O_3$, $In_2O_3$ and EuN as the starting materials. It is also possible to use $Sr_2N$, SrN or mixtures thereof in place of $Sr_3N_2$. Further, $In_2O_3$ may be replaced with other In compounds. Those materials are weighed and mixed so that the aimed composition can be obtained, and the prepared powdery mixture is then fired in a crucible to produce the aimed fluorescent substance. The materials are mixed, for example, in a mortar in a glove box. The crucible is made of, for example, boron nitride, silicon nitride, silicon carbide, carbon, aluminum nitride, SiAlON, aluminum oxide, molybdenum or tungsten.

The process for production of the oxynitride fluorescent substance according to the embodiment comprises the step of firing the mixture of the starting materials for a predetermined time. The firing is preferably carried out under a pressure more than the atmospheric pressure. In order to prevent the material (2) such as silicon nitride from decomposing at a high temperature, the pressure is preferably not less than 5 atmospheres. The firing temperature is preferably in the range of 1500 to 2000° C., more preferably in the range of 1800 to 2000° C. If the temperature is less than 1500° C., it is often difficult to obtain the aimed fluorescent substance. On the other hand, if the temperature is more than 2000° C., there is a fear that the materials or the product may be sublimated. Further, since the material AlN is liable to be oxidized, the firing is preferably carried out under $N_2$ atmosphere. In that case, $N_2/H_2$ mixed gas atmosphere is also usable.

The fired product in the form of powder is then subjected to after-treatment such as washing, if necessary, to obtain a fluorescent substance according to the embodiment. If performed, washing can be carried out with acid or pure water.

Red Light-Emitting Fluorescent Substance

A first red light-emitting fluorescent substance according to the embodiment is produced by the above-described process. Specifically, that is an oxynitride fluorescent substance which emits luminescence having a peak in the wavelength range of 570 to 650 nm under excitation by light in the wavelength range of 250 to 500 nm and which is obtained by firing the above materials (1) to (4) in the presence of the material (5).

The crystal structure of fluorescent substance can be identified by X-ray diffraction or neutron diffraction. The red light-emitting fluorescent substance of the embodiment preferably has a crystal structure exhibiting the XRD profile same as $Sr_2Al_3Si_7ON_{13}$, and it is also preferred to have a crystal structure in which the constituting elements of $Sr_2Al_3Si_7ON_{13}$ are replaced with other elements so as to change the lattice constants within particular ranges. FIG. 1 is an XRD profile of the basic $Sr_2Al_3Si_7ON_{13}$. The constituting elements of $Sr_2Al_3Si_7ON_{13}$ are replaced with other elements in such a way described below in detail. Specifically, Sr in the crystal is replaced with the element M and/or the emission center element EC; the site of Si is filled with one or more elements selected from the group consisting of tetravalent elements such as Ge, Sn, Ti, Zr and Hf; the site of Al is filled with one or more elements selected from the group consisting of trivalent elements such as B, Sc, Y, La, Gd and Lu; and the site of O or N is filled with one or more elements selected from the group consisting of O, N and C. Further, Al and Si may be partly substituted with each other, and O and N may be partly substituted with each other. Examples of that substance include $Sr_2Al_2Si_8N_{14}$, $Sr_2Al_4Si_6O_2N_{12}$, $Sr_2Al_{15}Si_5O_3N_{11}$ and $Sr_2Al_6Si_4O_4N_{10}$. These substances have crystal structures based on $Sr_2Al_3Si_7ON_{13}$.

In the case where the crystal is slightly fused, it can be judged whether or not the fused crystal has a structure based on $Sr_2Al_3Si_7ON_{13}$ by the following simple method. The XRD profile of the modified crystal is measured, and the positions of the diffraction peaks are compared with those in the XRD profile of $Sr_2Al_3Si_7ON_{13}$. As a result, if the positions of the main peaks are identical, those crystal structures can be regarded as the same. As the main peaks for comparison, it is preferred to select 10 peaks having strong diffraction intensity.

One of the oxynitride fluorescent substances produced by the aforementioned process can be represented by a compositional formula. Specifically, a second red light-emitting fluorescent substance according to the embodiment is represented by the following formula (I):

$$(M_{1-x}EC_x)_a M^1{}_b M^2{}_c L_c O_d N_e \qquad (I).$$

In the formula, $M^1$ is a metal element selected from the group consisting of tetravalent metal elements, $M^2$ is a metal element selected from the group consisting of trivalent metal elements other than In(III) and Ga(III), L is a metal element selected from the group consisting of In(III) and Ga(III), M is a metal element selected from the group consisting of metal elements other than $M^1$, $M^2$, In(III) and Ga(III), EC is an emission center element other than any of the aforesaid metal elements, and x, a, b, c, d and e are numbers satisfying the conditions of $0<x<0.4$, $0.65<a<0.80$, $2<b<3$, $0<c<0.1$, $0.3<d<0.6$ and $4<e<5$, respectively. The numbers preferably satisfy the conditions of $0.02 \leq x \leq 0.2$, $0.665 \leq a \leq 0.73$, $2.2 \leq b \leq 2.7$, $0<c \leq 0.05$, $0.35 \leq d \leq 0.49$ and $4.2 \leq e \leq 4.7$, respectively.

The composition ratio of the metal element L is more than 0 in the above, and this does not mean that the content of the element L is below the measurement limit of analyzing apparatus. Specifically, even if the element L is not detected when the fluorescent substance is analyzed by means of an apparatus having the highest detection sensitivity at present, the technology may become so improved that the element L will be detected in the future. In that case, such fluorescent substance is included in the second fluorescent substance according to the embodiment. Further, even in the case where the content of the element L is still below the measurement limit, such fluorescent substance is obviously included in the first fluorescent substance according to the embodiment, provided that the material (5) is used in the production process thereof.

The composition of oxynitride fluorescent substance can be analyzed in any known manner, for example, in the following manner.

The contents of M, $M^1$, $M^2$ and EC can be measured by, for example, inductively coupled plasma atomic emission spectroscopic analysis (often referred to as "ICP analysis"). Specifically, the sample of oxynitride fluorescent substance is weighed in a platinum crucible and then decomposed by alkali fusion. After an internal standard element Y is added, the decomposed sample is dissolved to prepare a sample solution, which is subsequently subjected to ICP analysis. The analysis can be carried out by means of, for example, an ICP emission spectrometry (SPS-4000 [trademark], manufactured by SII Nano Technology Inc.).

The contents of O and N can be measured, for example, by the inert gas fusion method. Specifically, the sample of oxynitride fluorescent substance is heated to melt in a graphite crucible, and O atoms contained in the sample are converted into CO with inert gas transfer. The CO is further oxidized into $CO_2$, which is then measured by IR absorption spectroscopy to determine the content of O. After the $CO_2$ is removed from the sample, the content of N is measured by the heat conduction method. The measurement can be carried out by means of, for example, an oxygen, nitrogen-hydrogen analyzer (TC-600 [trademark], manufactured by LECO corporation (US)).

The content of In can be measured by ICP analysis. Specifically, the sample of oxynitride fluorescent substance is weighed in a pressure decomposition vessel, and then acid-decomposed under pressure to prepare a sample solution, which is subsequently subjected to ICP analysis. The analysis can be carried out by means of, for example, an ICP emission spectrometry (SPQ-9000 [trademark], manufactured by SII Nano Technology Inc.).

The content of Ga can be also measured by ICP analysis. In this case, a sample solution is prepared in the same manner as the measurement of the element M, and then subjected to ICP analysis by means of, for example, an ICP emission spectrometry (SPS-1500V [trademark], manufactured by SII Nano Technology Inc.).

Light-Emitting Device and Light-Emitting Device Module

A light-emitting device according to the embodiment comprises the above red light-emitting fluorescent substance and a light-emitting element capable of exciting the fluorescent substance.

The device according to one aspect of the embodiment comprises: a light-emitting element, such as a LED, serving as an excitation source; and a combination of the aforementioned red fluorescent substance (R) and a green fluorescent substance (G) each of which emits luminescence under excitation by light given off from the light-emitting element. Accordingly, the light-emitting device radiates light synthesized with emissions from the light-emitting element and the red and green fluorescent substances.

The light-emitting device according to the other embodiment comprises: a light-emitting element serving as an excitation source; and a combination of the above red fluorescent substance (R), the above green fluorescent substance (G) and a blue fluorescent substance (B) each of which emits luminescence under excitation by light given off from the light-emitting element.

The light-emitting device according to either embodiment can adopt either of the first and second fluorescent substances of the embodiment.

The light-emitting element used in the device is properly selected according to the fluorescent substances used together. Specifically, it is necessary that light given off from the light-emitting element be capable of exciting the fluorescent substances. Further, if the device is preferred to radiate white light, the light-emitting element preferably gives off light of such a wavelength that it can complement luminescence emitted from the fluorescent substances.

In view of the above, if the device comprises the red and green fluorescent substances, the light-emitting element (S1) is generally so selected that it gives off light in the wavelength range of 250 to 500 nm. If the device comprises the red, green and blue fluorescent substances, the light-emitting element (S2) is generally so selected that it gives off light of 250 to 430 nm.

Figure 2:
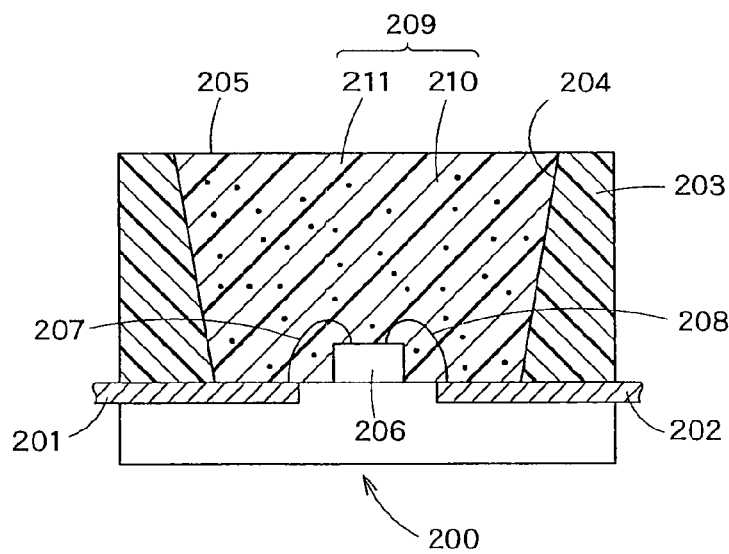
FIG. 2 shows a vertical sectional view schematically illustrating a structure of a light-emitting device utilizing a fluorescent substance according to an embodiment.

The light-emitting device according to the embodiment can be in the form of any conventionally known light-emitting device. FIG. 2 is a vertical sectional view schematically illustrating a package cup-type light-emitting device of the embodiment.

In the light-emitting device shown in FIG. 2, a resin stem 200 comprises leads 201 and 202 molded as parts of a lead frame and also a resin member 203 formed by unified molding together with the lead frame. The resin member 203 gives a concavity 205 in which the top opening is larger than the bottom. On the inside wall of the concavity, a reflective surface 204 is provided.

At the center of the nearly circular bottom of the concavity 205, a light-emitting element 206 is mounted with Ag paste or the like. Examples of the light-emitting element 206 include a light-emitting diode and a laser diode. The light-emitting element may radiate UV light. There is no particular restriction on the light-emitting element. Accordingly, it is also possible to adopt an element capable of emitting blue, bluish violet or near UV light as well as UV light. For example, a semiconductor light-emitting element such as GaN can be used as the light-emitting element. The electrodes (not shown) of the light-emitting element 206 are connected to the leads 201 and 202 by way of bonding wires 207 and 208 made of Au or the like, respectively. The positions of the leads 201 and 202 can be adequately modified.

In the concavity 205 of the resin member 203, a phosphor layer 209 is provided. For forming the phosphor layer 209, a fluorescent substance 210 of the embodiment can be dispersed or precipitated in a resin layer 211 made of silicone resin or the like in an amount of 5 to 50 wt %. The fluorescent substance of the embodiment comprises an oxynitride matrix having high covalency, and hence is generally so hydrophobic that it has good compatibility with the resin. Accordingly, scattering at the interface between the resin and the fluorescent substance is prevented enough to improve the light-extraction efficiency.

The light-emitting element 206 may be of a flip chip type in which n-type and p-type electrodes are placed on the same plane. This element can avoid troubles concerning the wires, such as disconnection or dislocation of the wires and light-absorption by the wires. In that case, therefore, a semiconductor light-emitting device excellent both in reliability and in luminance can be obtained. Further, it is also possible to employ an n-type substrate in the light-emitting element 206 so as to produce a light-emitting device constituted as described below. In that device, an n-type electrode is formed on the back surface of the n-type substrate while a p-type electrode is formed on the top surface of the semiconductor layer on the substrate. One of the n-type and p-type electrodes is mounted on one of the leads, and the other electrode is connected to the other lead by way of a wire. The size of the light-emitting element 206 and the dimension and shape of the concavity 205 can be properly changed.

Figures 3A, 3B:
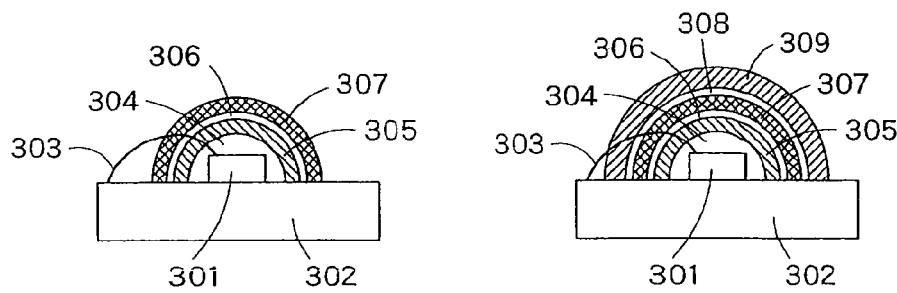
FIGS. 3A and 3B show vertical sectional views schematically illustrating structures of other light-emitting devices utilizing a fluorescent substance according to an embodiment.

FIG. 3 illustrates schematic vertical sectional views of shell-type light-emitting devices according to another embodiment. In the light-emitting device shown in FIG. 3A, a diode 301 emitting light having an emission peak at, for example, 445 nm is soldered on a package substrate 302 made of AlN and the like, and is connected to an electrode by way of an electroconductive wire 303. Further, the light-emitting diode 301 is domed with a transparent resin layer 304 made of silicone resin or the like, and thereon a transparent resin layer 305 containing the red light-emitting fluorescent substance, a transparent resin layer 306 and a transparent resin layer 307 containing the green light-emitting fluorescent substance are stacked in order. The device of FIG. 3A thus comprises the light-emitting element and the red and green light-emitting fluorescent substances each of which gives off luminescence under excitation by light emitted from the diode. The device can be further provided with a layer of blue light-emitting fluorescent substance. FIG. 3B shows a schematic vertical sectional view of such device, which further comprises a transparent resin layer 308 and a layer 309 containing the blue light-emitting fluorescent substance. Those layers are formed on the green fluorescent substance layer 307 of the device shown in FIG. 3A. The light-emitting diode used in the device of FIG. 3B is generally designed to radiate light containing blue component in a less amount than that in the device of FIG. 3A. This is because the excitation light and the luminescence emitted from each fluorescent substance are so designed that the light-emitting device can give off light of desired color, such as while light, in total.

The light-emitting device according to the embodiment is not restricted to the package cup-type and the shell-type shown in FIGS. 2 and 3, respectively, and can be freely applied to any type of devices. For example, even if the fluorescent substance according to the embodiment is used in a surface-mount type light-emitting device, the same effect can be obtained.

Meanwhile, a light-emitting device module according to the embodiment comprises a plural number of the aforementioned light-emitting devices arranged on a substrate. Any of the above light-emitting devices, which comprise the fluorescent substance of the embodiment, can be freely selected to be used in the module. For example, the shell-type device described above is one of those preferably employed in the module. Specifically, the light-emitting device module comprises a plural number of any of the following light-emitting devices:

(1) a light-emitting device having a laminate structure produced by the steps of: providing, on a substrate, a light-emitting element (S1) giving off light in the wavelength range of 250 to 500 nm; forming thereover a dome with transparent resin; coating the dome with the above fluorescent substance (R) dispersed in transparent resin; and applying thereon a green fluorescent substance (G) dispersed in transparent resin; and (2) a light-emitting device having a laminate structure produced by the steps of: providing, on a substrate, a light-emitting element (S2) giving off light in the wavelength range of 250 to 430 nm; forming thereover a dome with transparent resin; coating the dome with the above fluorescent substance (R) dispersed in transparent resin; applying thereon a green fluorescent substance (G) dispersed in transparent resin; and further applying thereon a blue fluorescent substance (B) dispersed in transparent resin.

There is no particular restriction on materials of the substrate, and hence it can be freely selected from known materials according to the aim. Examples of the materials include glass, silicone, semiconductors and resins.

The surface of the substrate may be subjected to various modifications according to necessity. For example, wiring or isolation structures for the light-emitting devices can be laid on the surface. Further, in order to improve heat-dissipating, a heat-sinking layer can be formed thereon. The substrate in itself may be a heat-sinking substrate excellent in thermal conductivity.

The green fluorescent substance emit luminescence having a peak in the wavelength range of 490 to 580 nm when excited by light given off from the light-emitting element (S1) or (S2), and the blue fluorescent substance emit luminescence having a peak in the wavelength range of 400 to 490 nm when excited by light given off from the light-emitting element (S1) or (S2).

The light-emitting devices are regularly or irregularly arranged on the substrate to form a light-emitting device module. Since having excellent temperature characteristics, the fluorescent substance of the embodiment is hardly affected by heat generated in operation. Accordingly, the devices comprising the fluorescent substances can be arranged so densely that the interval among them can be shortened. For example, the aforementioned shell-type devices seem to be circles or ellipses when seen from above, and they can be placed in such an arrangement as satisfies the condition of $1 \leq (d/a) \leq 5$ in which "a" and "d" are the major axis length of the ellipses and the shortest distance among them, respectively. The "major axis length" here means the longest diameter of the horizontal section of each light-emitting device. In other words, if each light-emitting device has a circular or elliptical horizontal section, it means its diameter or its major axis length, respectively. If necessary, the light-emitting devices can have sections in any shapes, such as rectangles, polygons or lines. In that case, the interval among them cannot be uniformly regulated. Even so, however, the interval among them can be shortened enough to enhance the luminance of the whole light-emitting device module. That is because the fluorescent substance of the embodiment is so excellent in temperature characteristics that its luminescence is hardly affected by heat generated by the adjacent light-emitting devices in operation.

It is indispensable to employ a red light-emitting fluorescent substance of the embodiment in a light-emitting device or a light-emitting device module according to the embodiment. However, as for the green light-emitting fluorescent substance (G) and the blue light-emitting fluorescent substance (B), there is no particular restriction. The red fluorescent substance (R) of the embodiment has such excellent temperature characteristics that it is hardly affected by temperature change. In order to utilize this advantage to the utmost, both the green fluorescent substance (G) and the blue one (B) are preferably excellent in temperature characteristics, too. If comprising those preferred fluorescent substances, the light-emitting device or module gives off light less changed in color even when the temperature is changed. That is not only because the red fluorescent substance emits luminescence less changed in intensity but also because the other fluorescent substances emit luminescence less changed in intensity, too.

As described above, since comprising the red fluorescent substance having temperature characteristics excellent enough to be hardly affected by temperature change, the light-emitting device or module is particularly suitable for working under a high temperature condition.

One of the green fluorescent substances (G) preferably used in the light-emitting device or module of the embodiment belongs among SiAlON phosphors like the above red fluorescent substance does, but the basic crystal structure thereof is different from that of the red fluorescent substance.

The green fluorescent substance (G) is based on $Sr_3Si_{13}Al_3O_2N_{21}$, which belongs to an orthorhombic system. The constituting elements thereof are partly replaced with light-emitting elements like those of the red fluorescent substance are. The modification such as replacement may slightly change the crystal structure, but the effect of the embodiment can be obtained provided that the basic crystal structure is not essentially changed. To what extent the basic crystal structure is not changed is the same as that of the red fluorescent substance.

The green fluorescent substance can be identified by X-ray diffraction or neutron diffraction. The green fluorescent substance includes not only a fluorescent substance exhibiting the XRD profile same as $Sr_3Si_{13}Al_3O_2N_{21}$, but also a substance in which the constituting elements of $Sr_3Si_{13}Al_3O_2N_{21}$ are replaced with other elements so as to change the lattice constants within particular ranges.

The light-emitting device or module according to the embodiment also preferably comprises a blue fluorescent substance excellent in temperature characteristics. Examples of the preferred blue fluorescent substance include (Ba,Eu)MgAl$_{10}$O$_{17}$, (Sr,Ca,Ba,Eu)$_{10}$(PO$_4$)$_5$O$_2$ and (Sr,Eu)Si$_9$Al$_{19}$ON$_{31}$.

The embodiment is further explained by the following examples, which by no means restrict the embodiment.

Example 1

As the starting materials, Sr$_3$N$_2$, EuN, Si$_3$N$_4$, Al$_2$O$_3$, AlN and Ga$_2$O$_3$ in the amounts of 2.308 g, 0.697 g, 4.583 g, 0.454 g, 1.339 g and 0.039 g, respectively, were weighed and dry-mixed in an agate mortar in a vacuum glove box. The mixture was placed in a BN crucible and then fired at 1850° C. for 4 hours under 7.5 atm of N$_2$ atmosphere, to synthesize a fluorescent substance.

Example 2

The procedure of Example 1 was repeated except that the amounts of Al$_2$O$_3$ and Ga$_2$O$_3$ were changed into 0.262 g and 0.394 g, respectively, to synthesize a fluorescent substance.

Example 3

As the starting materials, Sr$_3$N$_2$, EuN, Si$_3$N$_4$, Al$_2$O$_3$, AlN and GaN in the amounts of 2.308 g, 0.697 g, 4.583 g, 0.476 g, 1.322 g and 0.035 g, respectively, were weighed and dry-mixed in an agate mortar in a vacuum glove box. The mixture was placed in a BN crucible and then fired at 1850° C. for 4 hours under 7.5 atm of N$_2$ atmosphere, to synthesize a fluorescent substance.

Example 4

The procedure of Example 3 was repeated except that the amounts of AlN and GaN were changed into 1.167 g and 0.352 g, respectively, to synthesize a fluorescent substance.

Comparative Example 1

The procedure of Example 1 was repeated except that Sr$_3$N$_2$, EuN, Si$_3$N$_4$, Al$_2$O$_3$ and AlN were used in the amounts of 2.308 g, 0.697 g, 4.583 g, 0.476 g and 1.339 g, respectively, to synthesize a fluorescent substance whose designed composition was (Sr$_{0.85}$Eu$_{0.15}$)$_2$Al$_3$Si$_7$ON$_{13}$.

Comparative Example 2

The procedure of Comparative Example 1 was repeated except that the amounts of Sr$_3$N$_2$ and EuN were changed into 2.443 g and 0.465 g, respectively, to synthesize a fluorescent substance whose designed composition was (Sr$_{0.9}$Eu$_{0.1}$)$_2$Al$_3$Si$_7$ON$_{13}$.

Comparative Example 3

The procedure of Comparative Example 1 was repeated except that the amounts of Sr$_3$N$_2$ and EuN were changed into 2.172 g and 0.929 g, respectively, to synthesize a fluorescent substance whose designed composition was (Sr$_{0.8}$Eu$_{0.2}$)$_2$Al$_3$Si$_7$ON$_{13}$.

Comparative Example 4

The procedure of Comparative Example 1 was repeated except that the amounts of Sr$_3$N$_2$ and EuN were changed into 1.629 g and 1.859 g, respectively, to synthesize a fluorescent substance whose designed composition was (Sr$_{0.6}$Eu$_{0.4}$)$_2$Al$_3$Si$_7$ON$_{13}$.

Comparative Example 5

The procedure of Comparative Example 1 was repeated except that the amounts of Sr$_3$N$_2$ and EuN were changed into 1.357 g and 2.324 g, respectively, to synthesize a fluorescent substance whose designed composition was (Sr$_{0.5}$Eu$_{0.5}$)$_2$Al$_3$Si$_7$ON$_{13}$.

Comparative Example 6

The procedure of Comparative Example 1 was repeated except that the amounts of Sr$_3$N$_2$ and EuN were changed into 0.543 g and 3.718 g, respectively, to synthesize a fluorescent substance whose designed composition was (Sr$_{0.2}$Eu$_{0.8}$)$_2$Al$_3$Si$_7$ON$_{13}$.

Example 5

As the starting materials, Sr$_3$N$_2$, EuN, Si$_3$N$_4$, Al$_2$O$_3$, AlN and In$_2$O$_3$ in the amounts of 2.308 g, 0.697 g, 4.583 g, 0.262 g, 1.339 g and 0.583 g, respectively, were weighed and dry-mixed in an agate mortar in a vacuum glove box. The mixture was placed in a BN crucible and then fired at 1850° C. for 4 hours under 7.5 atm of N$_2$ atmosphere, to synthesize a fluorescent substance.

Comparative Example 7

The procedure of Example 5 was repeated except that 0.583 g of In$_2$O$_3$ was replaced with 0.290 g of Sc$_2$O$_3$, to synthesize a fluorescent substance.

The fluorescent substances of Examples 1 to 5 were subjected to composition analysis, and the results were as set forth in Table 1. The composition ratios in Table 1 were normalized by regarding the content of Al as 1. The feed ratio of Al:Ga in the materials of Example 1 or 3 was 99:1, that of Al:Ga in the materials of Example 2 or 4 was 90:10, and that of Al:In in the materials of Example 5 was 90:10. However, all the resultant fluorescent substances contained them in ratios different from the feed ratios, and it was found that each fluorescent substance contained In or Ga in an amount smaller than the added amount.

TABLE 1

| | Sr | Eu | Al | Si | O | N | Ga | In |
|---|---|---|---|---|---|---|---|---|
| Ex. 1 | 0.58 | 0.10 | 1 | 2.33 | 0.40 | 4.22 | 0.00043 | — |
| Ex. 2 | 0.62 | 0.11 | 1 | 2.51 | 0.40 | 4.45 | 0.00150 | — |
| Ex. 3 | 0.58 | 0.10 | 1 | 2.38 | 0.47 | 4.33 | 0.00062 | — |
| Ex. 4 | 0.60 | 0.11 | 1 | 2.50 | 0.46 | 4.50 | 0.00083 | — |
| Ex. 5 | 0.61 | 0.11 | 1 | 2.50 | 0.38 | 4.63 | — | 0.0000037 |

Figure 4:
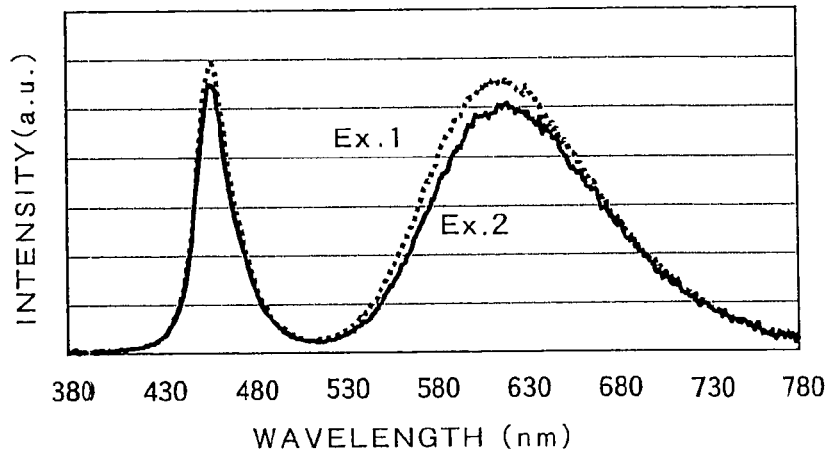
FIG. 4 shows emission spectra given by the red fluorescent substances of Examples 1 and 2 under excitation by light at 458 nm.
Figure 5:
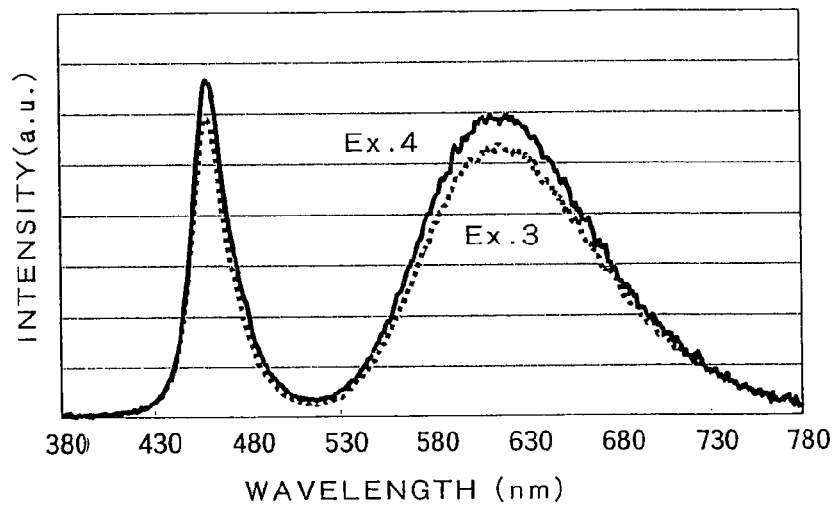
FIG. 5 shows emission spectra given by the red fluorescent substances of Examples 3 and 4 under excitation by light at 458 nm.

The red powdery substances of Examples 1 to 5 and Comparative Example 7 were pulverized and then excited with a LED light source emitting light having a peak at 458 nm. The obtained emission spectra were shown in FIGS. 4 to 6. In each of FIGS. 4 to 6, the peak at 458 nm was attributed to the reflection of the excitation light. As shown in Figures, each of the red powdery substances of Examples 1 to 5 showed a single emission band having a peak in the wavelength range of 615 to 620 nm. On the other hand, that of Comparative Example 7 showed a single emission band having a peak in the wavelength range 610 to 615 nm.

Figure 6:
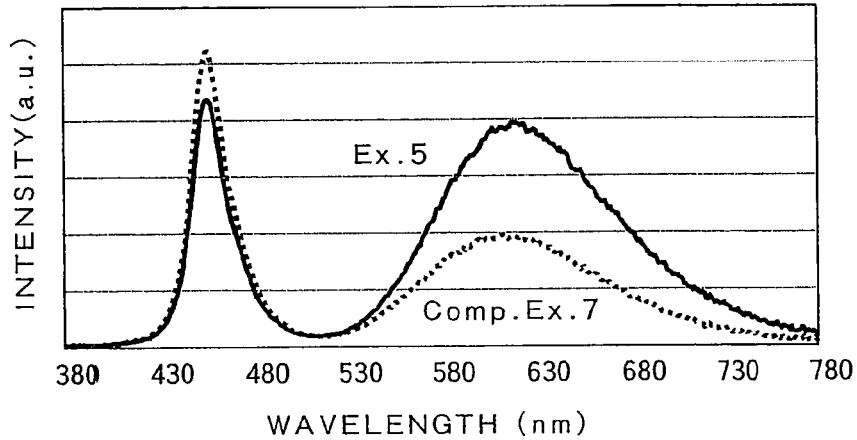
FIG. 6 shows emission spectra given by the red fluorescent substances of Example 5 and Comparative Example 7 under excitation by light at 458 nm.

As shown in FIG. 6, the red powder of Comparative Example 7 emitted luminescence having remarkably weaker intensity than that of Example 5, and accordingly was regarded as an inferior fluorescent substance. This indicates that, while the effect of the embodiment can be obtained if a compound containing Ga or In is used as the material in producing the fluorescent substance, the effect cannot be obtained if the compound containing Ga or In is replaced with a compound containing Sc.

Figure 7:
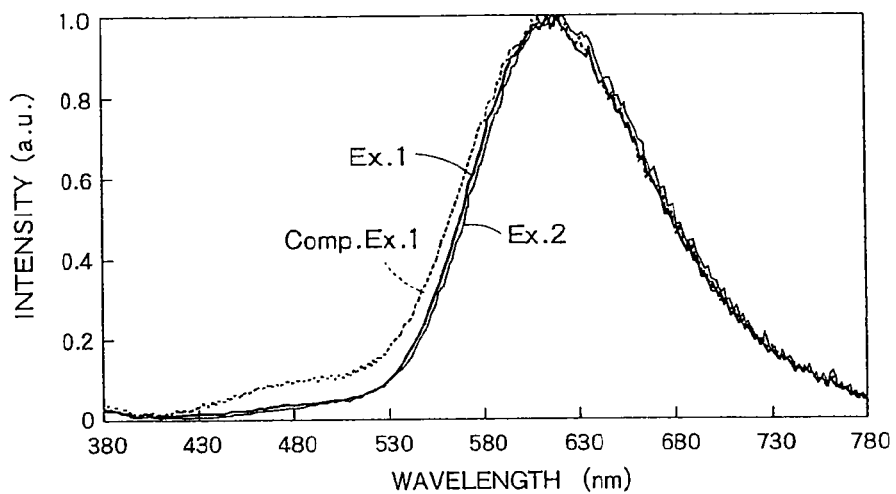
FIG. 7 shows emission spectra given by the red fluorescent substances of Examples 1, 2 and Comparative Example 1 under excitation by light at 365 nm.
Figure 8:
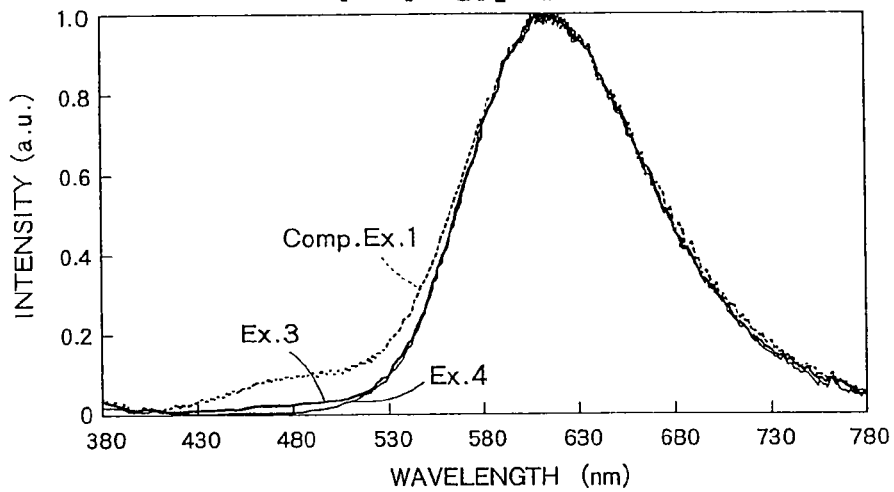
FIG. 8 shows emission spectra given by the red fluorescent substances of Examples 3, 4 and Comparative Example 1 under excitation by light at 365 nm.
Figure 9:
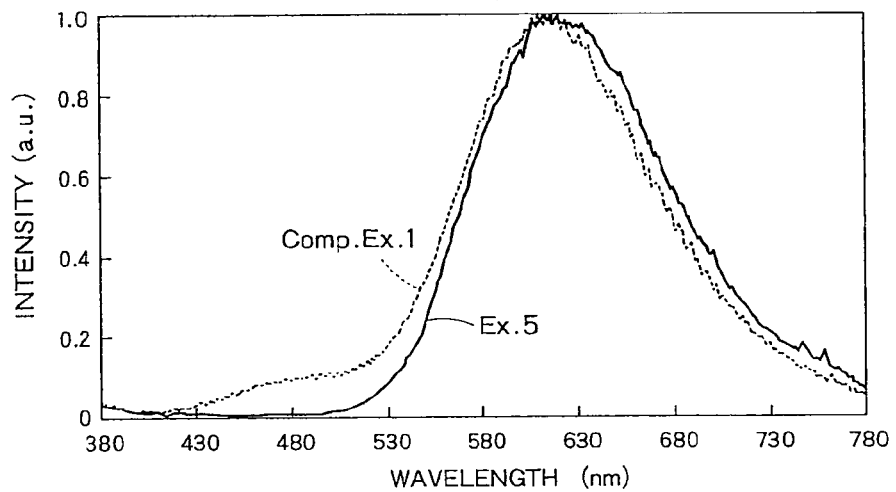
FIG. 9 shows emission spectra given by the red fluorescent substances of Example 5 and Comparative Example 1 under excitation by light at 365 nm.

Independently, the red powdery substances of Examples 1 to 5 and Comparative Example 1 were pulverized and then excited with a light source emitting light having a peak at 365 nm. The obtained emission spectra were shown in FIGS. 7 to 9. Further, FIGS. 10 to 12 shows chromaticity points calculated from those spectra.

As a result, it was found that the red fluorescent substances of Examples 1 to 5 emitted luminescence having a light-component of 400 to 580 nm in less amounts than that of Comparative Example 1.

With respect to the red fluorescent substances of Examples 1 to 5 and Comparative Example 1, Table 2 shows their chromaticity coordinates (x, y) in the CIE1931 chromaticity diagram.

TABLE 2

| | chromaticity coordinate (CIE1931) | |
|---|---|---|
| | Cx | Cy |
| Ex. 1 | 0.57 | 0.41 |
| Ex. 2 | 0.58 | 0.41 |
| Ex. 3 | 0.57 | 0.41 |
| Ex. 4 | 0.58 | 0.42 |
| Ex. 5 | 0.59 | 0.41 |
| Com. 1 | 0.54 | 0.41 |

Subsequently, the red powdery substances of Example 3 and Comparative Example 1 were excited while they were being heated with a heater from room temperature to 200° C., to measure the change of the emission spectra. The light source used for excitation was a LED emitting light having a peak at 458 nm. The results were shown in FIG. 13, which indicates temperature dependence of the peak intensities of the emission spectra. The relative intensity plotted on the y-axis in FIG. 13 was normalized under the condition that the intensity of each fluorescent substance at room temperature was regarded as 1.00.

Figure 13:
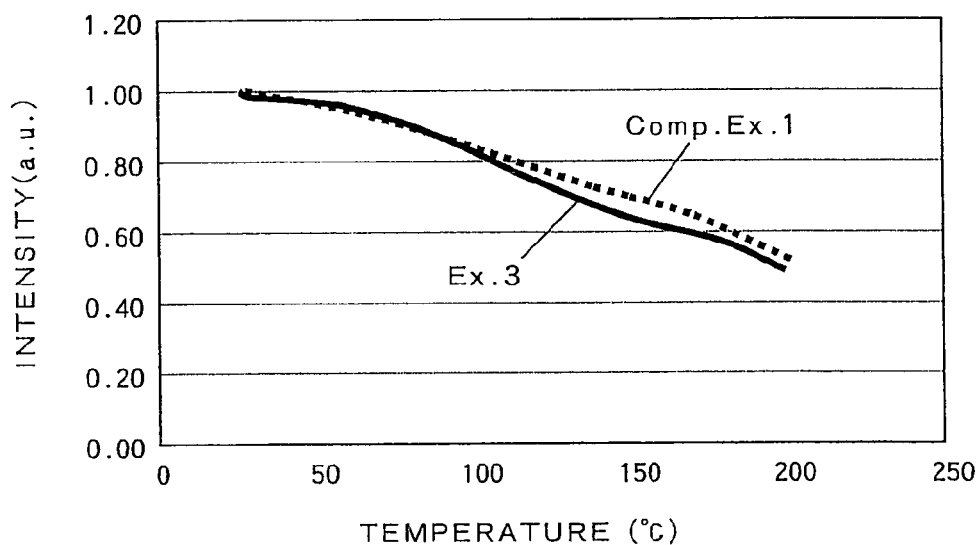
FIG. 13 is a graph showing temperature characteristics of emission intensities given by the red fluorescent substances of Example 3 and Comparative Example 1.
Figure 14:
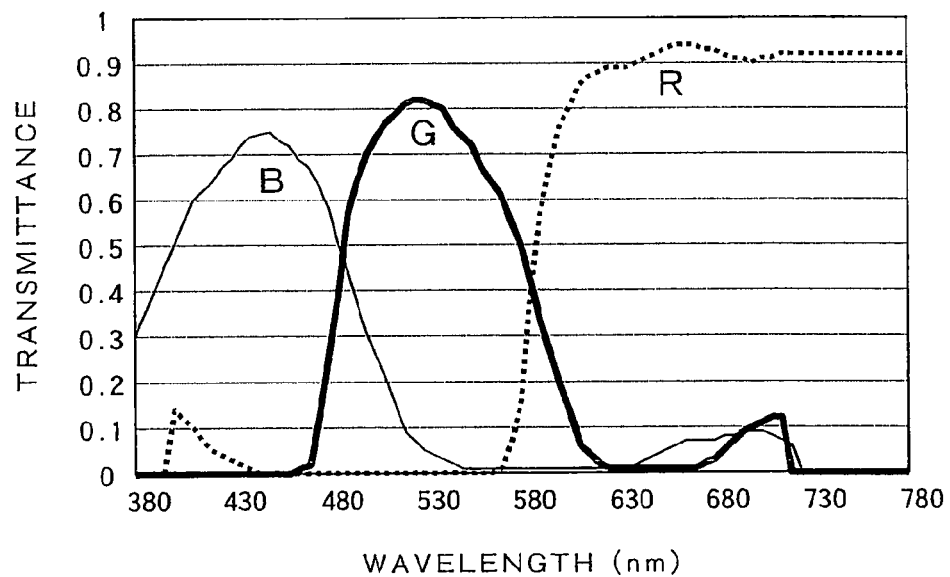
FIG. 14 shows transmission spectra of the color filters used in Application Examples 101 to 105 and Comparative Application Examples 102 to 106.

FIG. 13 shows that the red fluorescent substance of Example 3 had temperature characteristics as excellent as Comparative Example 1.

Application Examples 101 to 105 and Comparative Application Examples 102 to 106

A light-emitting device of Application Example 101 was produced by use of the fluorescent substance synthesized in Example 1. The device had a structure according to FIG. 3A. Specifically, a LED 301 emitting light having a peak at 440 nm was soldered on an 8 mm-square AlN package substrate 302, and was connected to electrodes by way of gold wires 303. The LED was then domed with transparent resin 304, and the dome was coated with a layer of transparent resin 305 containing the red fluorescent substance of Example 1. Further, another layer of transparent resin 306 and still another layer of transparent resin 307 containing a green fluorescent substance emitting luminescence having a peak at 520 nm were stacked thereon in order, to produce a light-emitting device.

The procedure of Application Example 101 was repeated except for using each of the fluorescent substances synthesized in Examples 2 to 5 and Comparative Examples 2 to 6, to produce each light-emitting device of Application Examples 102 to 105 and Comparative Application Examples 102 to 106.

The emission spectra of Application Examples 101 to 105 were measured and shown in FIG. 15, in which the relative intensity of each spectrum was normalized so that the area surrounded by the x-axis and the spectrum curve might be the same.

Application Examples 151 to 155 and Comparative Application Examples 152 to 156

A light-emitting device module of Application Example 151 was produced by use of the fluorescent substance synthesized in Example 1. FIG. 16 is a conceptual sketch showing the light-emitting device module of Application Example 151. This module comprised a heat-sinking substrate 1601 and plural shell-type light-emitting devices 1600 arranged thereon. Each shell-type light-emitting device had a structure shown in FIG. 3A. The light-emitting device module was produced in the following manner. First, sixteen LEDs 301 emitting light having a peak at 440 nm were prepared, and they were placed and soldered on the heat-sinking substrate 1601 in such an arrangement that the center-to-center interval among them might be 6 mm. Subsequently, each LED soldered on the substrate was connected to electrodes by way of gold wires 303. Each LED was then domed with transparent resin 304, and the dome was coated with a layer of transparent resin 305 containing the red fluorescent substance of Example 1. Further, another layer of transparent resin 306 and still another layer of transparent resin 307 containing a green fluorescent substance emitting luminescence having a peak at 520 nm were stacked thereon in order, to produce a light-emitting device module. Each device seemed to be a circle when seen from above, and its diameter was 2.8 mm.

The procedure of Application Example 151 was repeated except for using each of the fluorescent substances synthesized in Examples 2 to 5 and Comparative Examples 2 to 6, to produce each light-emitting device module of Application Examples 152 to 155 and Comparative Application Examples 152 to 156.

Figure 17:
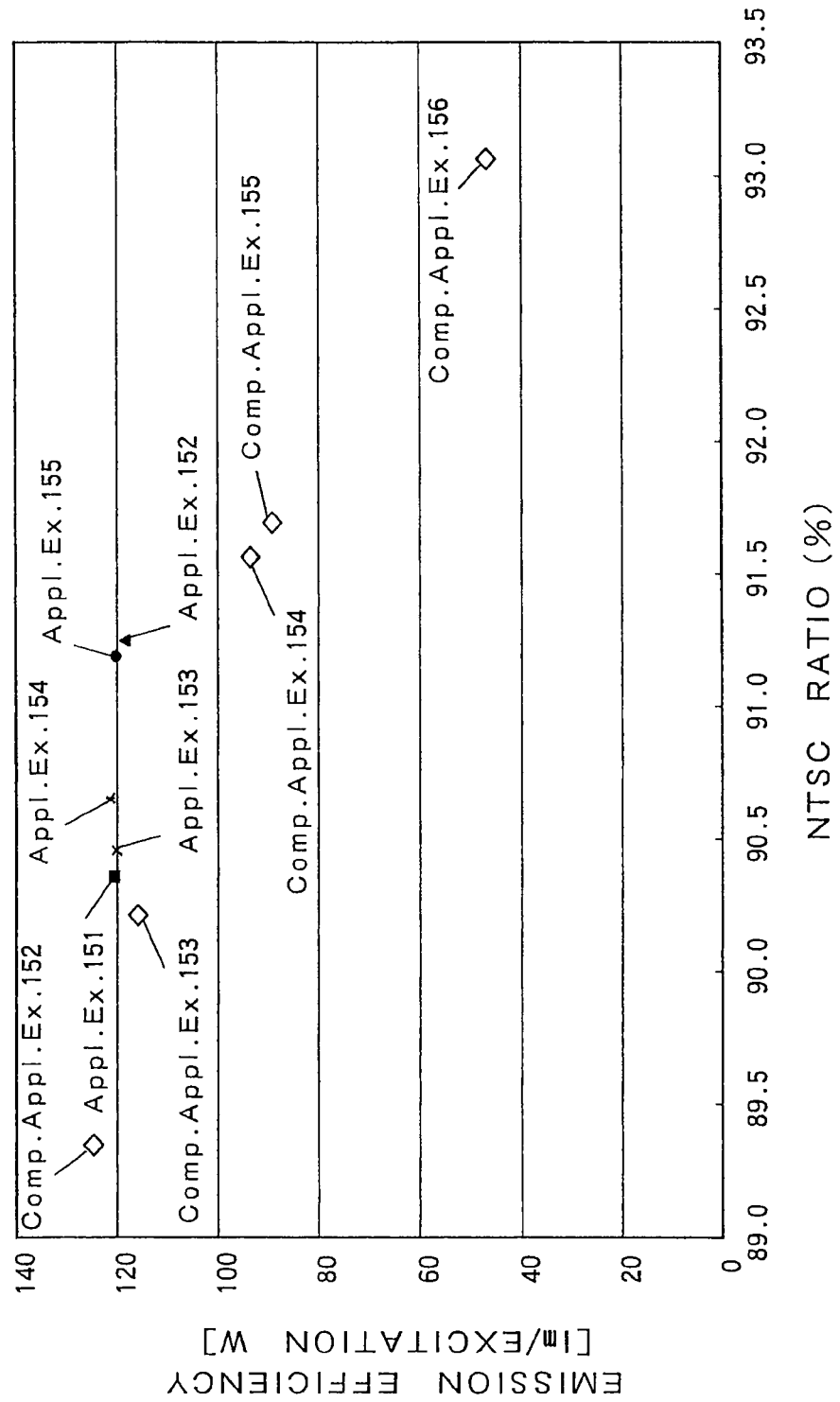
FIG. 17 is a graph showing the emission efficiency vs. NTSC ratio relation of the light-emitting device module produced in each of Application Examples 151 to 155 and Comparative Application Examples 152 to 156.

As for each module of Application Examples 151 to 155 and Comparative Application Examples 152 to 156, Table 3 and FIG. 17 show the emission efficiency and the NTSC ratio (i.e., value in the u'-v' chromaticity coordinate system on the CIE1976 chromaticity diagram) measured through a diffuser and color filters.

TABLE 3

| | NTSC ratio (%) | Emission efficiency of white light source [lm/W] (luminous efficacy) |
|---|---|---|
| Ap. Ex. 151 | 90.4 | 121 |
| Ap. Ex. 152 | 91.2 | 118 |
| Ap. Ex. 153 | 90.5 | 120 |
| Ap. Ex. 154 | 90.7 | 121 |
| Ap. Ex. 155 | 91.2 | 120 |
| Com. Ap. 152 | 89.3 | 125 |
| Com. Ap. 153 | 90.2 | 116 |
| Com. Ap. 154 | 91.6 | 94 |
| Com. Ap. 155 | 91.7 | 89 |
| Com. Ap. 156 | 93.1 | 47 |

The above results indicate that it was difficult for the modules of Comparative Application Examples 152 to 156, which adopted conventional fluorescent substances, to realize both high emission efficiencies and large NTSC ratios. On the other hand, however, the results also indicate that the modules of Application Examples 151 to 155 according to the embodiment realized both high emission efficiencies and large NTSC ratios, as compared with those of Comparative Application Examples.

Application Examples 201 to 205 and Comparative Application Examples 202 to 204 and 206

A light-emitting device of Application Example 201 was produced by use of the fluorescent substance synthesized in Example 1. The device had a structure according to FIG. 3B. Specifically, a LED 301 emitting light having a peak at 390 nm was soldered on an 8 mm-square AlN package substrate 302, and was connected to electrodes by way of gold wires 303. The LED was then domed with transparent resin 304, and the dome was coated with a layer of transparent resin 305 containing the red fluorescent substance of Example 1. Further, another layer of transparent resin 306, still another layer of transparent resin 307 containing a green fluorescent substance emitting luminescence having a peak at 520 nm, yet another layer of transparent resin 308 and still yet another layer of transparent resin 309 containing a blue fluorescent substance emitting luminescence having a peak at 452 nm were stacked thereon in order, to produce a light-emitting device.

The procedure of Application Example 201 was repeated except for using each of the fluorescent substances synthesized in Examples 2 to 5 and Comparative Examples 2 to 4 and 6, to produce each light-emitting device of Application Examples 202 to 205 and Comparative Application Examples 202 to 204 and 206.

The emission spectra of Application Examples 201 to 205 were measured and shown in FIG. 18, in which the relative intensity of each spectrum was normalized so that the area surrounded by the x-axis and the spectrum curve might be the same.

Application Examples 251 to 255 and Comparative Application Examples 252 to 254 and 256

A light-emitting device module of Application Example 251 was produced by use of the fluorescent substance synthesized in Example 1. FIG. 19 is a conceptual sketch showing the light-emitting device module of Application Example 251. This module comprised a heat-sinking substrate 1901 and plural shell-type light-emitting devices 1900 arranged thereon. Each shell-type light-emitting device had a structure shown in FIG. 3B. The light-emitting device module was produced in the following manner. First, sixteen LEDs 301 emitting light having a peak at 390 nm were prepared, and they were placed and soldered on the heat-sinking substrate 1901 in such an arrangement that the center-to-center interval among them might be 6 mm. Subsequently, each LED soldered on the substrate was connected to electrodes by way of gold wires 303. Each LED was then domed with transparent resin 304, and the dome was coated with a layer of transparent resin 305 containing the red fluorescent substance of Example 1. Further, another layer of transparent resin 306, still another layer of transparent resin 307 containing a green fluorescent substance emitting luminescence having a peak at 520 nm, yet another layer of transparent resin 308 and still yet another layer of transparent resin 309 containing a blue fluorescent substance emitting luminescence having a peak at 452 nm were stacked thereon in order, to produce a light-emitting device module. Each device seemed to be a circle when seen from above, and its diameter was 3.0 mm.

The procedure of Application Example 251 was repeated except for using each of the fluorescent substances synthesized in Examples 2 to 5 and Comparative Examples 2 to 4 and 6, to produce each light-emitting device module of Application Examples 252 to 255 and Comparative Application Examples 252 to 254 and 256.

Figure 20:
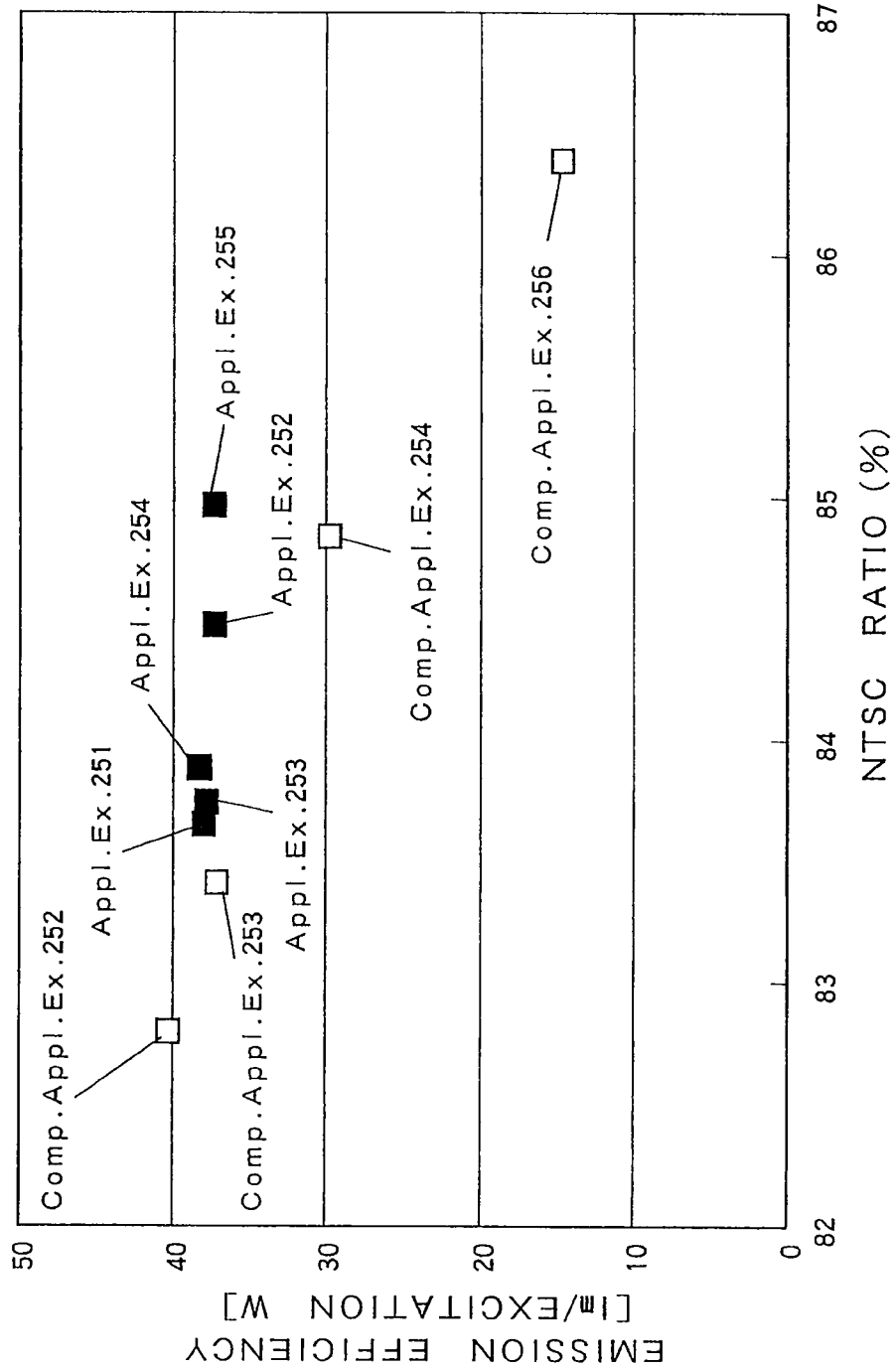
FIG. 20 is a graph showing the emission efficiency vs. NTSC ratio relation of the light-emitting device module produced in each of Application Examples 251 to 255 and Comparative Application Examples 252 to 254 and 256.

As for each module of Application Examples 251 to 255 and Comparative Application Examples 252 to 254 and 256, Table 4 and FIG. 20 show the emission efficiency and the NTSC ratio (i.e., value in the u'-v' chromaticity coordinate system on the CIE1976 chromaticity diagram) measured through a diffuser and color filters.

TABLE 4

| | NTSC ratio (%) | Emission efficiency of white light source [lm/W] (luminous efficacy) |
|---|---|---|
| Ap. Ex. 251 | 82.8 | 40.3 |
| Ap. Ex. 252 | 83.4 | 37.1 |
| Ap. Ex. 253 | 84.8 | 29.7 |
| Ap. Ex. 254 | 86.4 | 14.6 |
| Ap. Ex. 255 | 83.7 | 38.0 |
| Com. Ap. 252 | 84.5 | 37.3 |
| Com. Ap. 253 | 83.7 | 37.8 |
| Com. Ap. 254 | 83.9 | 38.2 |
| Com. Ap. 256 | 85.0 | 37.3 |

The above results indicate that it was difficult for the modules of Comparative Application Examples, which adopted conventional fluorescent substances, to realize both high emission efficiencies and large NTSC ratios. On the other hand, however, the results also indicate that the modules of Application Examples 251 to 255 according to the embodiment realized both high emission efficiencies and large NTSC ratios, as compared with those of Comparative Application Examples.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A process for production of a fluorescent substance which emits luminescence having a peak in the wavelength range of 570 to 650 nm under excitation by light in the wavelength range of 250 to 500 nm, the process comprising:
  mixing
  a compound containing a metal element $M^1$ selected from the group consisting of tetravalent metal elements,
  a compound containing a metal element $M^2$ selected from the group consisting of trivalent metal elements other than In(III) and Ga(III),
  a compound containing a metal element M selected from the group consisting of metal elements, with the proviso that M is not $M^1$, $M^2$, In(III) and Ga(III),
  a compound containing an emission center element EC, with the proviso that EC is not M, $M^1$, $M^2$, In(III) and Ga(III), and a compound containing a metal element L selected from the group consisting of an oxide or nitride of In(III) and an oxide or nitride of Ga(III), to prepare a material mixture; and firing the material mixture to produce the fluorescent substance;

wherein the fluorescent substance is of formula (I):

$$(M_{1-x}EC_x)_a M^1_b M^2_c L_c O_d N_e \quad (I)$$

wherein $0<x<0.4$, $0.65<a<0.80$, $2<b<3$, $0<c<0.1$, $0.3<d<0.6$ and $4<e<5$.

2. The process according to claim 1, wherein $M^1$ is Si, $M^2$ is Al, and M is Sr.

3. A fluorescent substance which emits luminescence having a peak in the wavelength range of 570 to 650 nm under excitation by light in the wavelength range of 250 to 500 nm, wherein the fluorescent substance is of formula (I):

$$(M_{1-x}EC_x)_a M^1_b M^2_c L_c O_d N_e \quad (I)$$

wherein $M^1$ is a metal element selected from the group consisting of tetravalent metal elements, $M^2$ is a metal element selected from the group consisting of trivalent metal elements other than In(III) and Ga(III), L is a metal element selected from the group consisting of an oxide or nitride of In(III) and an oxide or nitride of Ga(III), M is a metal element selected from the group consisting of metal elements other than $M^1$, $M^2$, In(III) and Ga(III), EC is an emission center element, with the proviso that EC is not M, $M^1$, $M^2$, In(III) and Ga(III), and $0<x<0.4$, $0.65<a<0.80$, $2<b<3$, $0<c<0.1$, $0.3<d<0.6$ and $4<e<5$, and the fluorescent substance is obtained by the process according to claim 1 wherein a crystal structure of the fluorescent substance is $M_2 M^1_7 M^2_3 ON_{13}$.

4. A light-emitting device comprising:

a light-emitting element (S1) giving off light in the wavelength range of 250 to 500 nm;

a fluorescent substance (R) which emits luminescence having a peak in the wavelength range of 570 to 650 nm under excitation by light given off from said light-emitting element (S1); wherein the fluorescent substance (R) is the fluorescent substance according to claim 3.

5. A light-emitting device comprising:

a light-emitting element (S2) giving off light in the wavelength range of 250 to 430 nm;

a fluorescent substance (R) which is the fluorescent substance according to claim 3;

a fluorescent substance (G) which emits luminescence having a peak in the wavelength range of 490 to 580 nm under excitation by light given off from the light-emitting element (S2); and a fluorescent substance (B) which emits luminescence having a peak in the wavelength range of 400 to 490 nm under excitation by light given off from said light-emitting element (S2).

6. A light-emitting device module which comprises a substrate and plural light-emitting devices provided thereon, each light-emitting device comprising:

a light-emitting element (S1) giving off light in the wavelength range of 250 to 500 nm;

a fluorescent substance (R) which is the fluorescent substance according to claim 3;

and a fluorescent substance (G) which emits luminescence having a peak in the wavelength range of 430 to 580 nm under excitation by light given off from the light-emitting element (S1).

7. A light-emitting device module which comprises a substrate and plural light-emitting devices provided thereon, each light-emitting device comprising:

a light-emitting element (S2) giving off light in the wavelength range of 250 to 430 nm;

a fluorescent substance (R) which is the fluorescent substance according to claim 3;

a fluorescent substance (G) which emits luminescence having a peak in the wavelength range of 490 to 580 nm under excitation by light given off from the light-emitting element (S2); and a fluorescent substance (B) which emits luminescence having a peak in the wavelength range of 400 to 490 nm under excitation by light given off from the light-emitting element (S2).

* * * * *